United States Patent
Takagi et al.

(10) Patent No.: US 7,935,544 B2
(45) Date of Patent: May 3, 2011

(54) METHOD OF MANUFACTURING ORGANIC LIGHT-EMITTING DEVICE

(75) Inventors: Kazunari Takagi, Tokyo (JP); Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/337,160

(22) Filed: Dec. 17, 2008

(65) Prior Publication Data

US 2009/0162949 A1    Jun. 25, 2009

(30) Foreign Application Priority Data

Dec. 21, 2007   (JP) ................................. 2007-329927

(51) Int. Cl.
    *H01L 21/00*    (2006.01)
(52) U.S. Cl. .......... 438/4; 438/38; 257/40; 257/E51.018
(58) Field of Classification Search ........................ None
    See application file for complete search history.

(56) References Cited

U.S. PATENT DOCUMENTS

| | | | |
|---|---|---|---|
| 6,753,195 B2 * | 6/2004 | Kuo ................. | 438/14 |
| 7,220,603 B2 * | 5/2007 | Hirakata et al. ................. | 438/5 |
| 7,226,332 B2 * | 6/2007 | Arai et al. ........................ | 445/24 |
| 2002/0042152 A1 * | 4/2002 | Yamazaki et al. ................ | 438/4 |
| 2004/0099862 A1 * | 5/2004 | Suzuki et al. .................... | 257/40 |
| 2006/0163490 A1 * | 7/2006 | Tang et al. ................. | 250/443.1 |

FOREIGN PATENT DOCUMENTS

| | | |
|---|---|---|
| JP | 07-312290 | 11/1995 |
| JP | 11-312580 | 11/1999 |
| JP | 2001-085156 | 3/2001 |
| JP | 2003-051384 | 2/2003 |
| JP | 2003-173873 | 6/2003 |
| JP | 2003-264073 | 9/2003 |
| JP | 2006-092886 | 4/2006 |
| JP | 2006-210213 | 8/2006 |
| JP | 2007-128663 | 5/2007 |

OTHER PUBLICATIONS

Japanese Patent Office Action Corresponding to Japanese Serial No. 2007-329927 dated Nov. 25, 2009.
Japanese Office Action issued on Feb. 23, 2010 in connection with counterpart JP Appl. No. 2007-329927.

* cited by examiner

*Primary Examiner* — Thanh V Pham
*Assistant Examiner* — Andres Munoz
(74) *Attorney, Agent, or Firm* — SNR Denton US LLP

(57) ABSTRACT

The present invention provides a method of manufacturing an organic light-emitting device which is applicable to a large-screen display device. The method includes the steps of: forming, over a drive substrate, an element region including a drive transistor, and an organic electroluminescence element in which, an anode, an organic layer and a cathode are stacked in this order; and after the formation of the element region, repairing a short circuit area while setting at least the element region in an atmosphere in which an oxygen concentration is 0.1% or higher and less than 1% and a dew point is −50 degrees or less, and applying a voltage across the anode and the cathode.

5 Claims, 15 Drawing Sheets

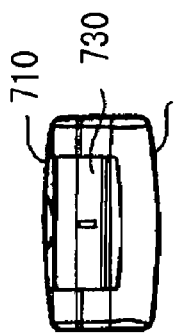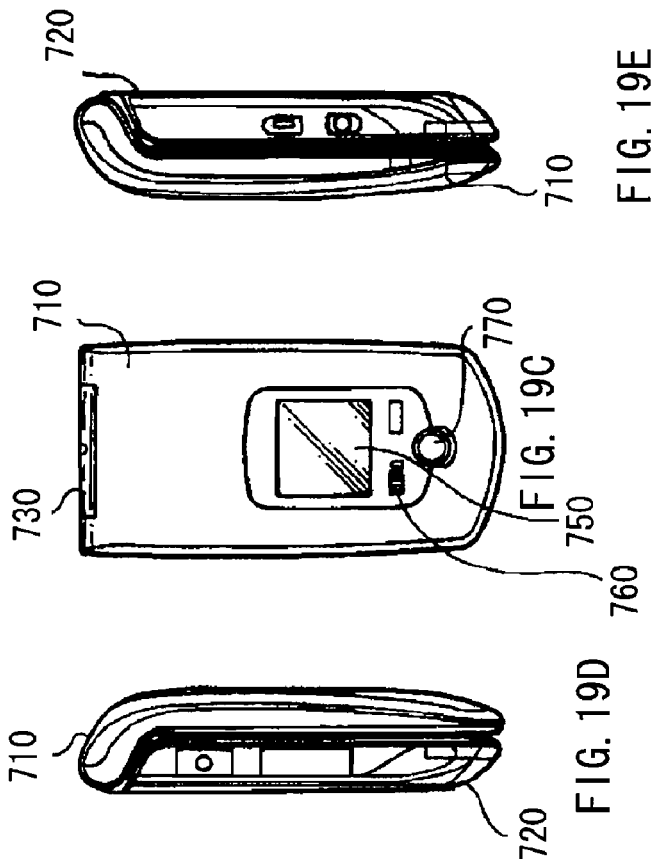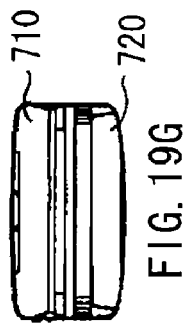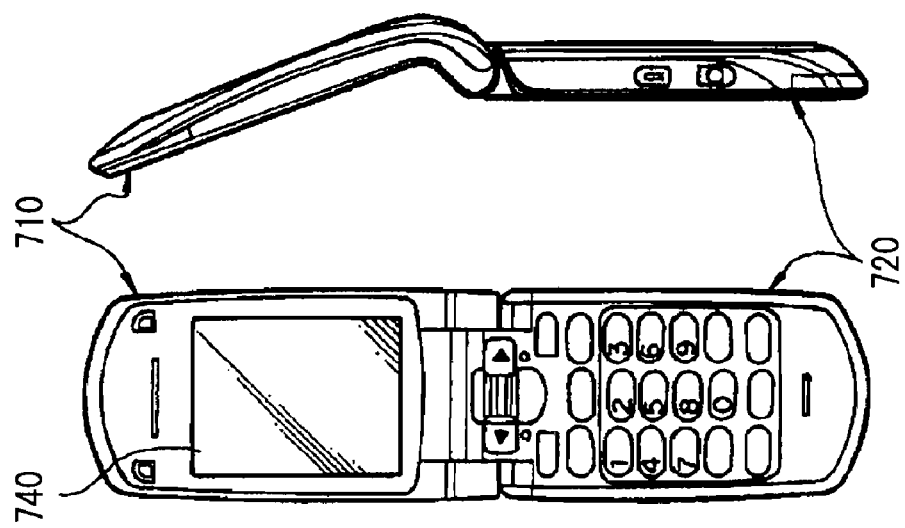

METHOD OF MANUFACTURING ORGANIC LIGHT-EMITTING DEVICE

CROSS REFERENCE TO RELATED APPLICATIONS

The present invention contains subject matter related to Japanese Patent Application JP 2007-329927 filed in the Japanese Patent Office on Dec. 21, 2007, the entire contents of which being incorporated herein by reference.

BACKGROUND OF THE INVENTION

1. Field of the Invention

The present invention relates to a method of manufacturing an organic light-emitting device having an organic electroluminescence (EL) element.

2. Description of the Related Art

In recent years, display devices of the next generation are actively developed, and smaller space, higher brightness, lower power consumption, and the like are in demand. As such a display device, attention is being paid to an organic light-emitting device using an organic electroluminescence element. The organic light-emitting device has characteristics such that since it is of a light-emitting type, the view angle is wide, backlight is unnecessary, so that power consumption is expected, response is high, and the device is thin. Consequently, application to a large-screen display device such as a television is strongly demanded.

The organic electroluminescence element has an organic layer including a light emission layer between an anode and a cathode. The methods of driving the organic electroluminescence element include: a simple matrix driving method of controlling light-on and light-off of any of pixels arranged in a matrix by a voltage applied to a cross point between a selected line and a signal line; and an active matrix driving method of controlling light-on and light-off of any of pixels arranged in a matrix by a switching element corresponding to the pixel. In the active matrix driving method, the anode is connected to one of signal terminals of a TFT (Thin Film Transistor) as a switching element.

In such a process of manufacturing an organic light-emitting device, in some cases, a pin hole or the like is formed in a thin organic layer due to a small particle or the like. The pin hole or the like becomes an area where an electric short circuit occurs between the anode and the cathode sandwiching the organic layer. All or part of the current to be passed to the organic layer flows to the short-circuit area. As a result, a phenomenon occurs such that the organic electroluminescence element does not emit light or becomes dark. A pixel in which such the phenomenon occurs is recognized as a display defect. To avoid the phenomenon, various methods are proposed.

As an example of a method of related art, an organic electroluminescence element is formed and, before a protection film or a sealing layer is formed, aging is performed. The short-circuit area is repaired by using a self healing phenomenon (refer to, for example, Japanese Unexamined Patent Application Publication No. 2003-173873 (patent document 1) and Japanese Patent No. 3,575,468 (patent document 2).

SUMMARY OF THE INVENTION

In the case of applying the organic light-emitting device to a large-screen display device, the probability of existence of a display defect in one screen is very high. To produce the devices with high yield, a countermeasure against the short-circuit is almost necessary. When a display device is turned on and driven, depending on a load of the driving or drive time, a display defect may occur also after completion of manufacture.

However, the repairing methods of related art disclosed in the patent documents 1 and 2 have the following shortcomings when the methods are applied to a large-screen display device.

Specifically, to increase the size of a screen, from the viewpoint of cost or productivity, it is desired to use an amorphous silicon TFT as the mainstream of a liquid crystal display device at present. However, in the amorphous silicon TFT, it is generally known that the I-V characteristic has temperature dependence. Consequently, during voltage application for repairing, current rise due to the temperature dependence of the TFT characteristic is caused by heat generation of the organic electroluminescence element. The inventors of the present invention have recognized that the current rise does not stop due to the synergetic effect with temperature rise caused by heat generation of the organic electroluminescence element itself and destroys the display device itself.

The phenomenon appears more conspicuously when the total current amount of the display device increases as the size of the screen increases, and is a very big issue at the time of applying the organic light-emitting device to a large-screen display device.

In the patent document 2, an electric field is applied to obtain a sufficiently high aging effect and a heat treatment is performed. Light emission time is 12 to 100 hours, and the atmosphere is a vacuum atmosphere. However, in the case of applying the technique to a large-screen display device, in a state where the electric field is applied, the current rise and temperature rise as described above occur. Consequently, it is difficult to perform the heat treatment.

It is therefore desirable to provide a method of manufacturing an organic light-emitting device which is applicable to a large-screen display device.

According to an embodiment of the present invention, there is provided a method of manufacturing an organic light-emitting device including the steps of: forming, over a drive substrate, an element region including a drive transistor, and an organic electroluminescence element in which, an anode, an organic layer, and a cathode are stacked in this order; and after forming the element region, a repairing a short circuit area while setting at least the element region in an atmosphere in which an oxygen concentration is 0.1% or higher and less than 1% and a dew point is −50 degrees or less, and applying a voltage across the anode and the cathode. To be concrete, preferably, the repairing is performed in a state where the drive substrate over which the element region is formed is housed in a chamber and a gas is introduced into the chamber. Alternatively, it is preferable to perform the repairing on the drive substrate over which the element region is formed under normal atmosphere and to temporarily seal the element region in the drive substrate.

In the method of manufacturing an organic light-emitting device of the embodiment of the present invention, the repairing is performed by setting at least the element region in an atmosphere in which an oxygen concentration is 0.1% or higher and less than 1% and a dew point is −50 degrees or less. Concretely, the drive substrate over which the element region is formed is housed in a chamber, and a gas is introduced in the chamber. The drive substrate over which the element region is formed is put under normal atmosphere, and the element region of the drive substrate is temporarily sealed. Consequently, temperature rise accompanying heat generation of the organic electroluminescence element caused by application of voltage is reduced, and the element region is cooled or radiated. Therefore, excessive rise in current is suppressed, and the repairing process is performed in a state where current is sufficiently stable.

According to the method of manufacturing the organic electroluminescence element of the embodiment of the present invention, at least the element region is put in the atmosphere in which an oxygen concentration is 0.1% or higher and less than 1% and a dew point is −50 degrees or less. Therefore, while suppressing temperature rise or current rise, a pin hole (short-circuit area) in the organic layer causing a display defect is repaired. Thus, the present invention is suitably applied to a large-screen display device using an amorphous silicon TFT in which temperature dependence of the I-V characteristic is high, and a high repairing effect can be obtained.

Other and further objects, features and advantages of the invention will appear more fully from the following description.

BRIEF DESCRIPTION OF THE DRAWINGS

FIG. 19A is a front view of an open state of application example 5, FIG. 19B is a side view of the open state, FIG. 19C is a front view showing a closed state, FIG. 19D is a left side view, FIG. 19E is a right side view, FIG. 19F is a top view, and FIG. 19G is a bottom view.

DETAILED DESCRIPTION OF THE PREFERRED EMBODIMENTS

Embodiments of the present invention will be described in detail hereinbelow with reference to the drawings.

First Embodiment

Figure 1:
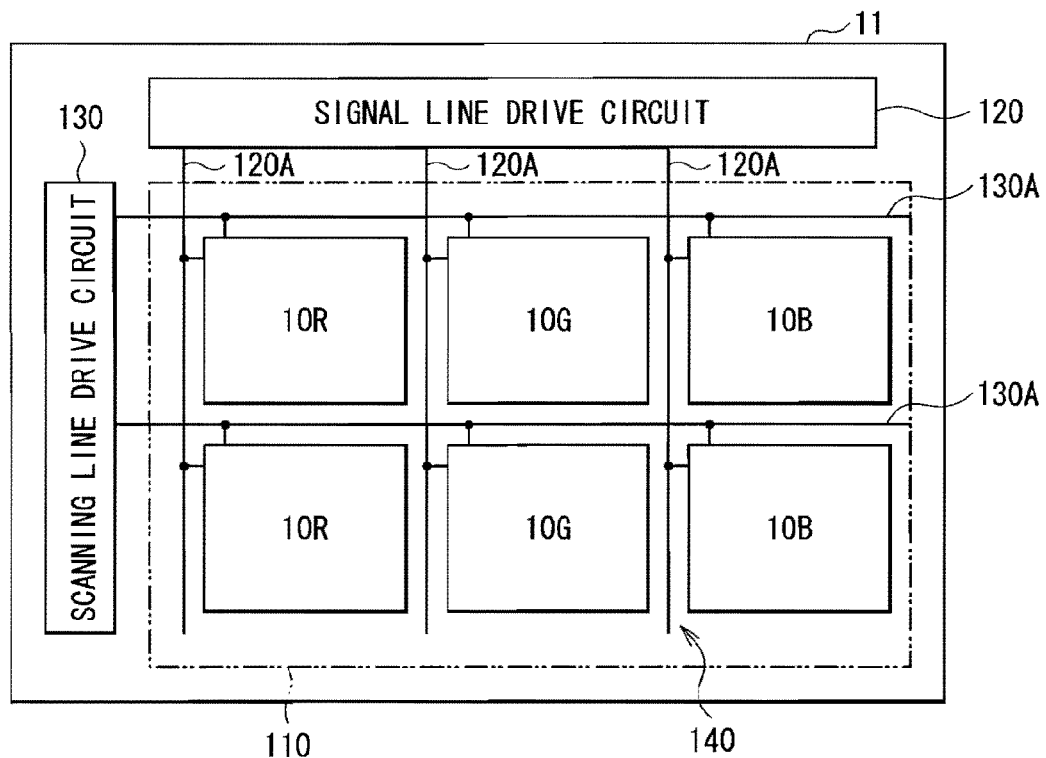
FIG. 1 is a diagram showing a configuration of an organic light-emitting device as a first embodiment of the present invention.

FIG. 1 shows the configuration of an organic light-emitting device manufactured by a method of manufacturing an organic light-emitting device as a first embodiment of the present invention. The organic light-emitting device is used as an organic EL television and is formed as follows. For example, on a drive substrate 11 made of glass, an element region 110 in which a plurality of organic electroluminescence elements 10R, 10G, and 10B to be described later are disposed in a matrix is formed. A signal line drive circuit 120 and a scanning line drive circuit 130 as drivers for displaying a video image are formed in the peripheries of the element region 110.

Figure 2:
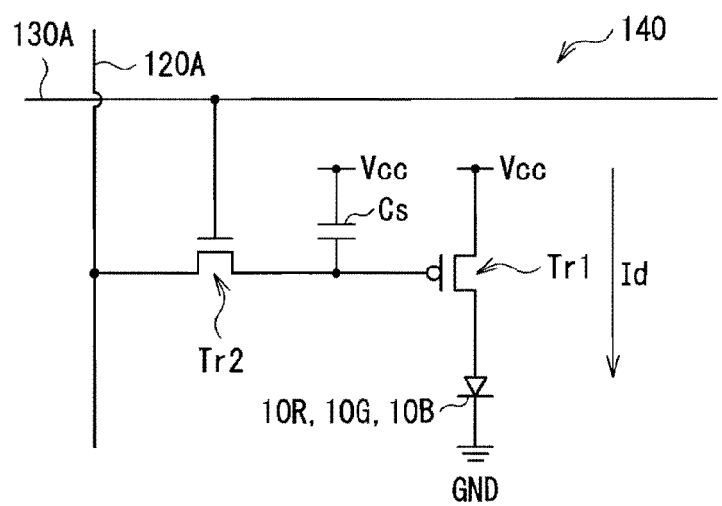
FIG. 2 is a diagram showing an example of a pixel drive circuit illustrated in FIG. 1.

A pixel drive circuit 140 is formed in the element region 110. FIG. 2 shows an example of the pixel drive circuit 140. The pixel drive circuit 140 is an active-type drive circuit having a drive transistor Tr1 and a write transistor Tr2 formed as a layer under an anode 13 which will be described later, a capacitor (holding capacitor) Cs between the transistors Tr1 and Tr2, an organic electroluminescence element 10R (or 10G or 10B) connected in series with the drive transistor Tr1 between a first power source line (Vcc) and a second power source line (GND). In the case of a large-screen television, desirably, the drive transistor Tr1 and the write transistor Tr2 are, though not limited, amorphous silicon TFTs of an inverted stagger structure (so-called bottom gate type).

In the pixel drive circuit 140, a plurality of signal lines 120A are disposed in the column direction, and a plurality of scanning lines 130A are disposed in the row direction. Each of cross points between the signal lines 120A and the scanning lines 130A corresponds to any one (sub pixel) of the organic electroluminescence elements 10R, 10G, and 10B. Each of the signal lines 120A is connected to the signal line drive circuit 120, and an image signal is supplied from the signal line drive circuit 120 to the source electrode of the write transistor Tr2 via the signal line 120A. The scanning lines 130A are connected to the scanning line drive circuit 130 and the scan signals are sequentially supplied from the scanning line drive circuit 130 to the gate electrode of the write transistor Tr2 via the scanning lines 130A.

Figure 3:
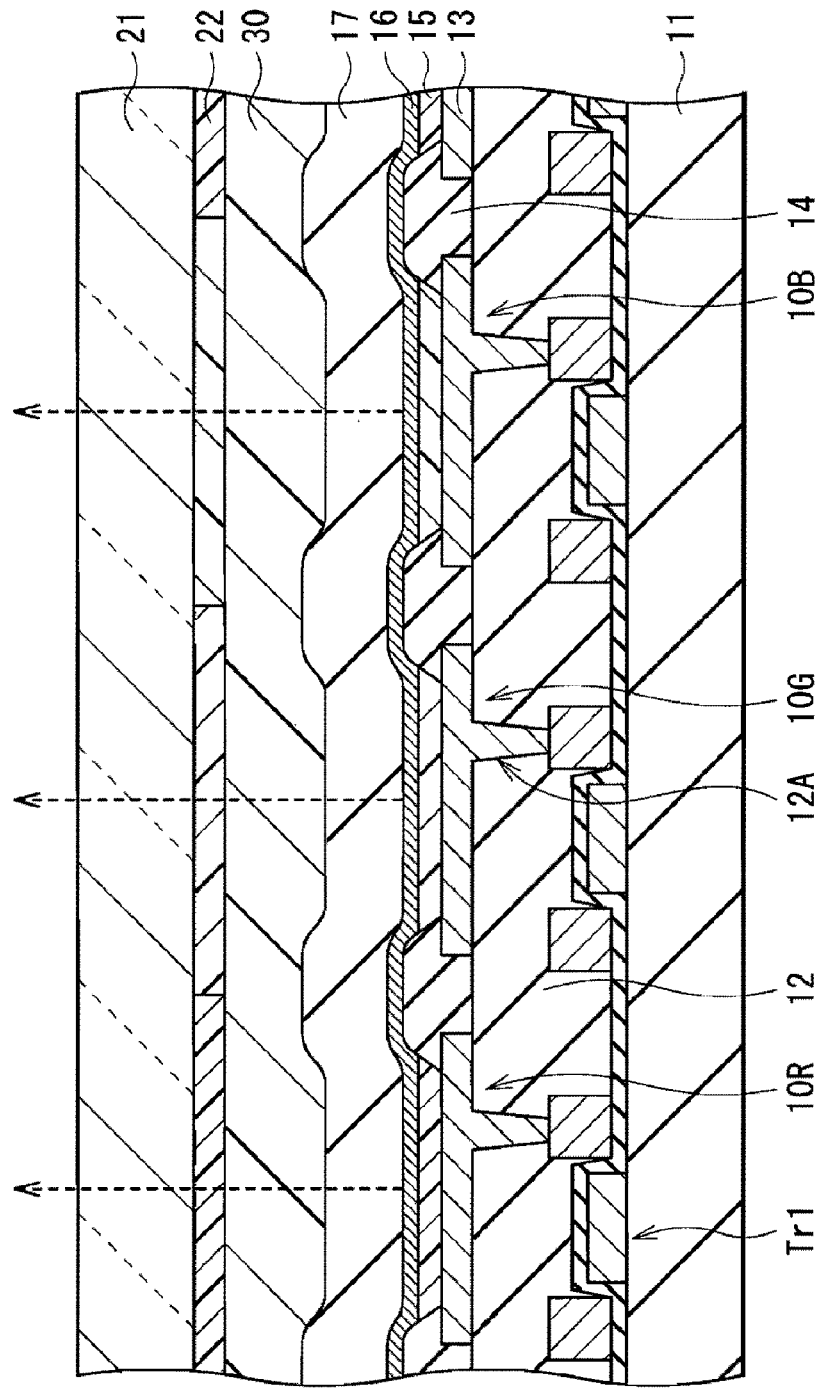
FIG. 3 is a cross section view showing the configuration of an element region illustrated in FIG. 1.

FIG. 3 shows a sectional configuration of the element region 110. In the element region 110, an organic electroluminescence element 10R for generating red light, an organic electroluminescence element 10G for generating green light, and an organic electroluminescence element 10B for generating blue light sequentially are formed in a matrix as a whole. Each of the organic electroluminescence elements 10R, 10G, and 10B has a planar strip shape and a combination of adjacent organic electroluminescence elements 10R, 10G, and 10G forms one pixel.

Each of the organic electroluminescence elements 10R, 10G, and 10B has a configuration in which the drive transistor Tr1 of the pixel drive circuit 140, a planarization insulating film 12, an anode 13, an interelectrode insulting film 14, an organic layer 15 including a light emission layer to be described later, and a cathode 16 are stacked in this order from the drive substrate 11 side.

Such organic electroluminescence elements 10R, 10G, and 10B are covered with a protection film 17 as necessary. The protection film 17 has, for example, a thickness of about 0.1 µm to 10 µm and is made of an inorganic material such as silicon oxide (SiOx), silicon nitride (SiNx) and silicon oxynitride (SiNxOy) or an organic material such as polyparaxylene or polyimide.

Over the protection film 17, an opposed substrate 21 is adhered with an adhesive layer 30 made of thermosetting resin, ultraviolet curing resin, or the like therebetween. The organic electroluminescence elements 10R, 10G, and 10B are sealed by the opposed substrate 21 and the protection film 17. The opposed substrate 21 is made of glass, a moisture proof film, or the like. As necessary, a color filter 22 and a light shield film (not shown) as a color conversion layer or black matrix may be provided.

The drive transistor Tr1 is electrically connected to the anode 13 via a connection hole 12A formed in the planarization insulting film 12.

The planarization insulating film 12 is provided to planarize the surface of the drive substrate 11 over which the pixel drive circuit 140 is formed and is made of, preferably, a material realizing high pattern precision so that the fine connection hole 12A is formed. Examples of the material of the planarization insulating film 12 are organic materials such as polyimide and inorganic materials such as silicon oxide ($SiO_2$).

The anodes 13 are formed in correspondence with the organic electroluminescence elements 10R, 10G, and 10B. The anode 13 has the function of a reflection electrode for reflecting light generated by the light emission layer and has, preferably, reflectance as high as possible to increase luminance efficiency. The anode 13 has, for example, a thickness of 100 nm or more and 1,000 nm or less and is made of a single metal element or alloy of silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), gold (Au) or the like.

The interelectrode insulating film 14 is provided to assure insulation between the anode 13 and the cathode 16 and to form the light emission region in an accurate desired shape. For example, the interelectrode insulating film 14 is made of an organic material such as polyimide or an inorganic insulting material such as silicon oxide ($SiO_2$). The interelectrode insulating film 14 has openings corresponding to the light emission regions in the anode 13. The organic layer 15 and the cathode 16 may be continuously provided not only on the light emission regions but also on the interelectrode insulting film 14. Light is emitted only from the opening in the interelectrode insulating film 14.

The organic layer 15 has a configuration in which, for example, a hole injecting layer, a hole transport layer, a light emission layer, and an electron transport layer (which are not shown) are stacked in order from the anode 13 side. Except for the light emission layer, these layers may be provided as necessary. The configuration of the organic layer 15 may be various according to the colors of light emitted by the organic electroluminescence elements 10R, 10G, and 10B. The hole injecting layer is a buffer layer to increase the hole injecting efficiency and to prevent leakage. The hole transport layer is provided to increase efficiency of transporting holes to the light emission layer. When an electric field is applied to the light emission layer, recombination of electrons and holes occur, and light is generated. The electron transport layer is to increase efficiency of transport of electrons to the light emission layer. The material of the organic layer 15 may be a general low-polymer or high-polymer organic material and is not particularly limited.

The cathode 16 is made of, for example, a single metal element or alloy of aluminum (Al), magnesium (Mg), calcium (Ca), sodium (Na). In particular, an alloy of magnesium and silver (MgAg alloy) or an alloy of aluminum (Al) and lithium (Li) (AlLi alloy) is preferable. The cathode 16 may be made of ITO (indium tin oxide) or IZO (indium zinc oxide). Preferably, the thickness of the cathode 16 is, for example, 5 nm or larger and 50 nm or less. In this range, the efficiency of extracting light generated by the light emission layer from the cathode 16 side can be made sufficiently high. In addition, in a repairing process to be described later, in the case of applying voltage across the anode 13 and the cathode 16, a repair can be made reliably by blowing or oxidizing and insulating the cathode 16 in which short circuit occurs by the self healing phenomenon.

For example, the organic light-emitting device may be manufactured as follows.

Figure 4:
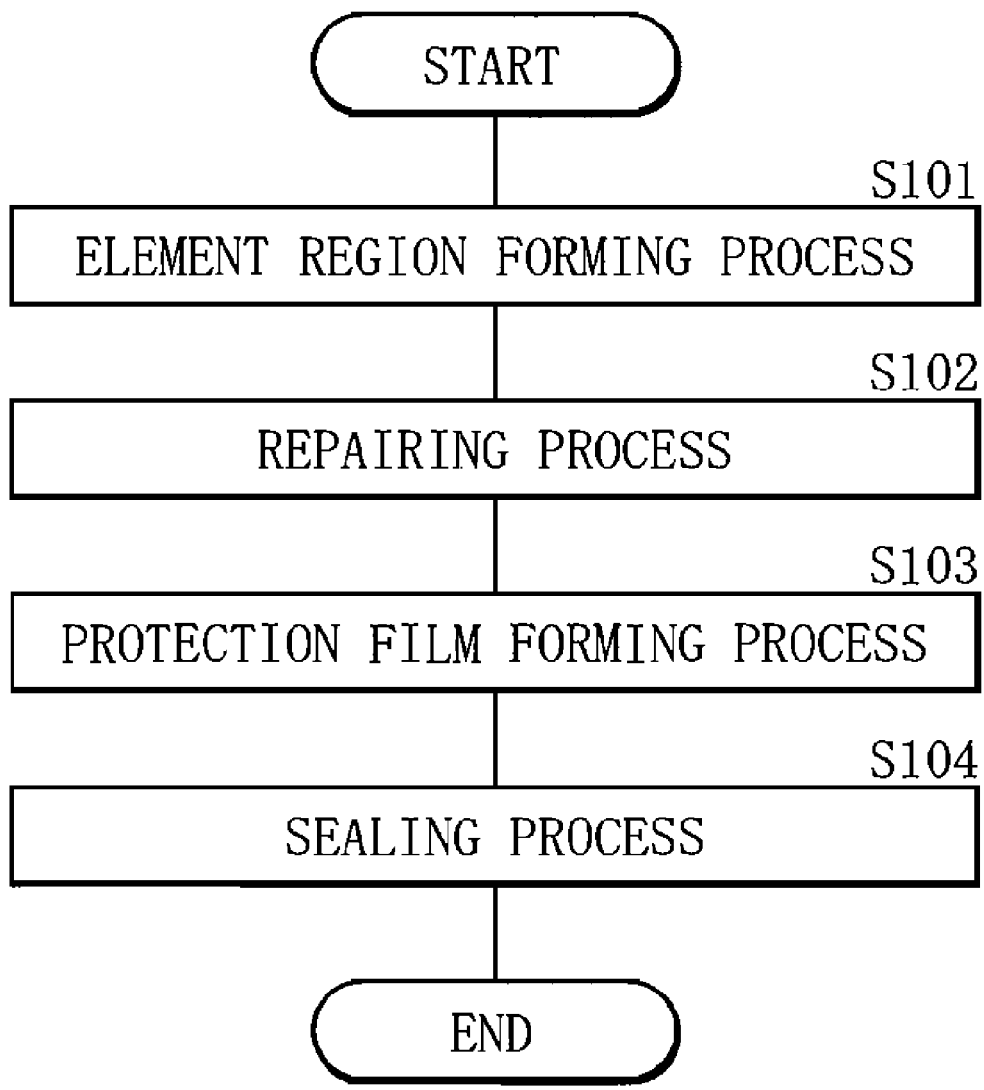
FIG. 4 is a diagram showing the flow of a method of manufacturing an organic light-emitting device illustrated in FIG. 1.

FIG. 4 shows the flow of a method of manufacturing the organic light-emitting device. The manufacturing method includes an element region forming process, a repairing process, a protection film forming process, and a sealing process.

Element Region Forming Process (Step S101)

First, over the drive substrate 11 made of the above-described material, the pixel drive circuit 140 including the drive transistor Tr1 is formed. Subsequently, the planarization insulating film 12 is formed by applying a photosensitive resin on the whole surface. The planarization insulating film 12 is patterned in a predetermined shape and the connection hole 12A is formed by exposure and development, and firing is performed.

Subsequently, the anode 13 made of the above-described material is formed by sputtering and is selectively removed by etching, thereby separating the planarization insulating film 12 into the organic electroluminescence elements 10R, 10G, and 10B. After that, the photosensitive resin is applied to the entire surface of the drive substrate 11. For example, by photolithography, openings are formed in correspondence with the light emitting regions, and firing is performed. As a result, the interelectrode insulating film 14 is formed. After formation of the interelectrode insulating film 14, for example, by evaporation, the organic layer 15 and the cathode 16 having the above-described thickness and made of the above-described materials are formed, and the organic electroluminescence elements 10R, 10G, and 10B as shown in FIG. 3 are formed. Consequently, the pixel drive circuit 140 including the drive transistor Tr1 and the element region 110 including the organic electroluminescence elements 10R, 10G, and 10B are formed over the drive substrate 11.

Repairing Process (Step S102)

Figure 5:
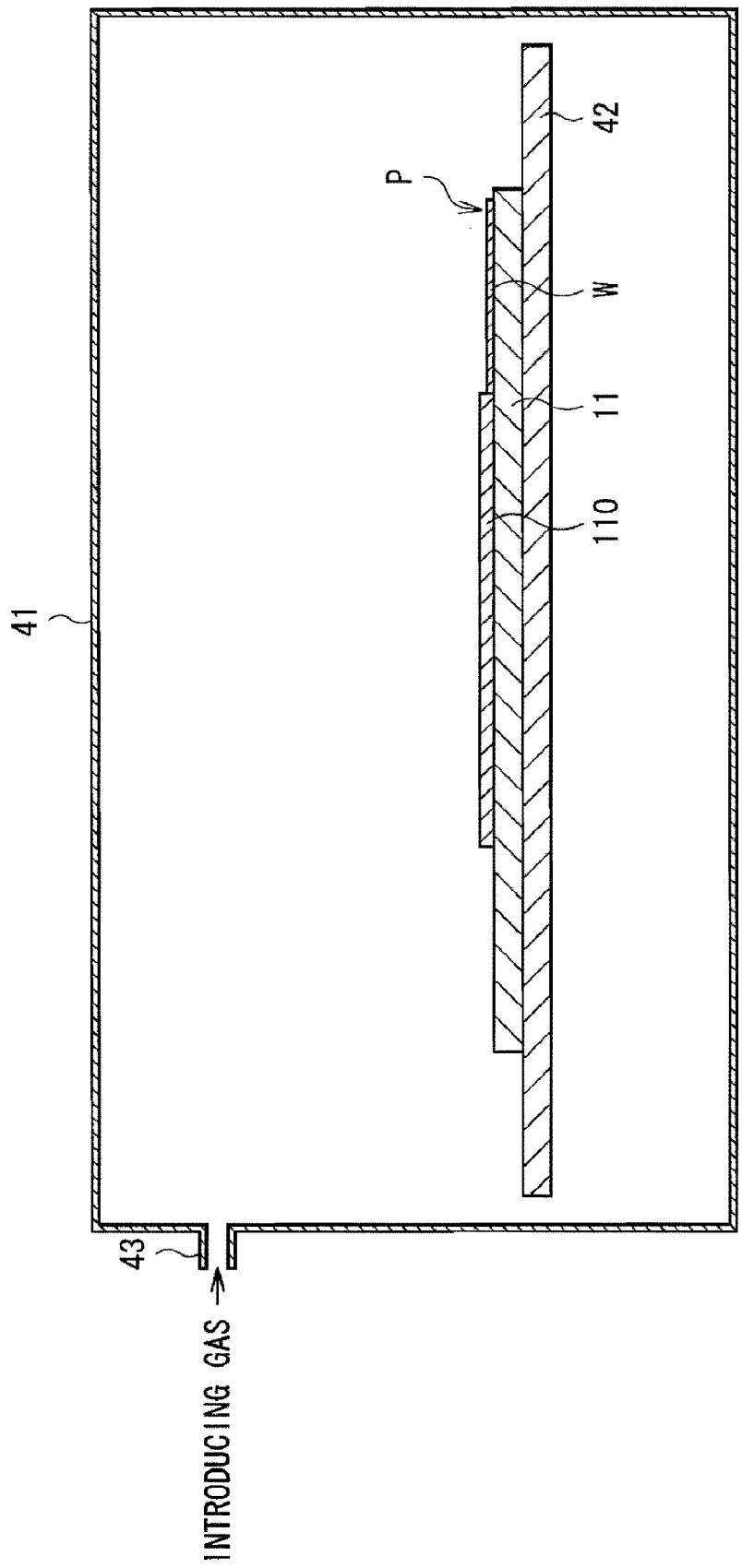
FIG. 5 is a diagram for explaining a repairing process shown in FIG. 4.

After formation of the element region 110, the drive substrate 11 is conveyed under vacuum atmosphere continuously managed from an evaporator, housed in an aging chamber 41 as shown in FIG. 5, and placed on a heat sink (radiating member) 42 made of aluminum (Al). Subsequently, a probe P is made contact with a wiring W led from the element region 110, and voltage is applied across the anode 13 and the cathode 16 of the organic electroluminescence elements 10R, 10G, and 10B. As a result, current flows in a pinhole (short circuit area) in the organic layer 15. By Joule heat generated at that time, the organic layer 15 in the periphery is evaporated, and the cathode 16 where short-circuit occurs is blown out or, by self-healing phenomenon of oxidation and insulation, the pinhole (short circuit area) is repaired.

By introducing gas from a gas introduction port 43 in the aging chamber 41, the inside of the aging chamber 41 is converted to atmosphere having an oxygen concentration which is 0.1% or higher and less than 1% and a dew point of −50 degrees or less, and repairing process is performed. By setting the oxygen concentration to 0.1% or higher and less than 1%, temperature rise accompanying heat generation of the organic electroluminescence elements 10R, 10G, and 10B due to voltage application is suppressed, and the element region 110 can be cooled or heated. Therefore, excessive rise in current is suppressed, and the repairing process can be performed in a state where the current is sufficiently stabilized. In the above-described patent document 1, the oxygen concentration is set to the range of 1% to 10%, both inclusive. By further decreasing the oxygen concentration, deterioration in normal regions in the organic electroluminescence elements 10R, 10G, and 10B due to oxidation can be suppressed. By setting the dew point to −50 degrees or less, a damage such as reduction (shrinking) in the light emitting regions can be suppressed.

In the repairing process, preferably, the voltage is applied across the anode 13 and the cathode 16 in an alternating application method of alternately applying a forward-direction potential and an inverse-direction potential, and the difference between the forward-direction potential and the inverse-direction potential applied to the organic electroluminescence elements 10R, 10G, and 10B is set to 30V or higher, and is equal to or less than the initial withstand voltage of the drive transistor Tr1. By setting the difference to 30V or higher, the effect of repairing the cathode 16 made of the above-described material and having the thickness can be reliably obtained. The reason why the difference is set to the initial withstand voltage of the drive transistor Tr1 or less is that the load applied on the drive transistor Tr1 has to be set to the initial withstand voltage of the drive transistor Tr1 or less so that the drive transistor Tr1 is not destroyed. The difference between the forward-direction potential and the inverse-direction potential applied to the organic electroluminescence elements 10R, 10G, and 10B is not the potential different at the time of forward bias and reverse bias of the Vcc potential but the difference of potentials effectively applied to the organic electroluminescence elements 10R, 10G, and 10B. 30V is, for example, 10V in the forward direction and 20V in the inverse direction. The pulse waveform, the forward-direction voltage, the inverse-direction voltage, and the application time are not limited.

Protection Film Forming Process (Step S103)

After performing the repairing process, the protection film 17 having the above-described thickness and made of the above-described material is formed by, for example, the CVD method, and the organic electroluminescence elements 10R, 10G, and 10B are covered with the protection film 17.

Sealing Process (Step S104)

After that, the adhesive layer 30 made of the above-described material is formed on the protection film 17. A color filter and the like are provided, and the opposed substrate 21 made of the above-described material is prepared and disposed on the side where the element region 110 of the drive substrate 11 is formed. The drive substrate 11 and the opposed substrate 21 are bonded with the adhesive layer 30 therebetween. As a result, the organic light-emitting device shown in FIG. 3 is completed.

Figure 6:
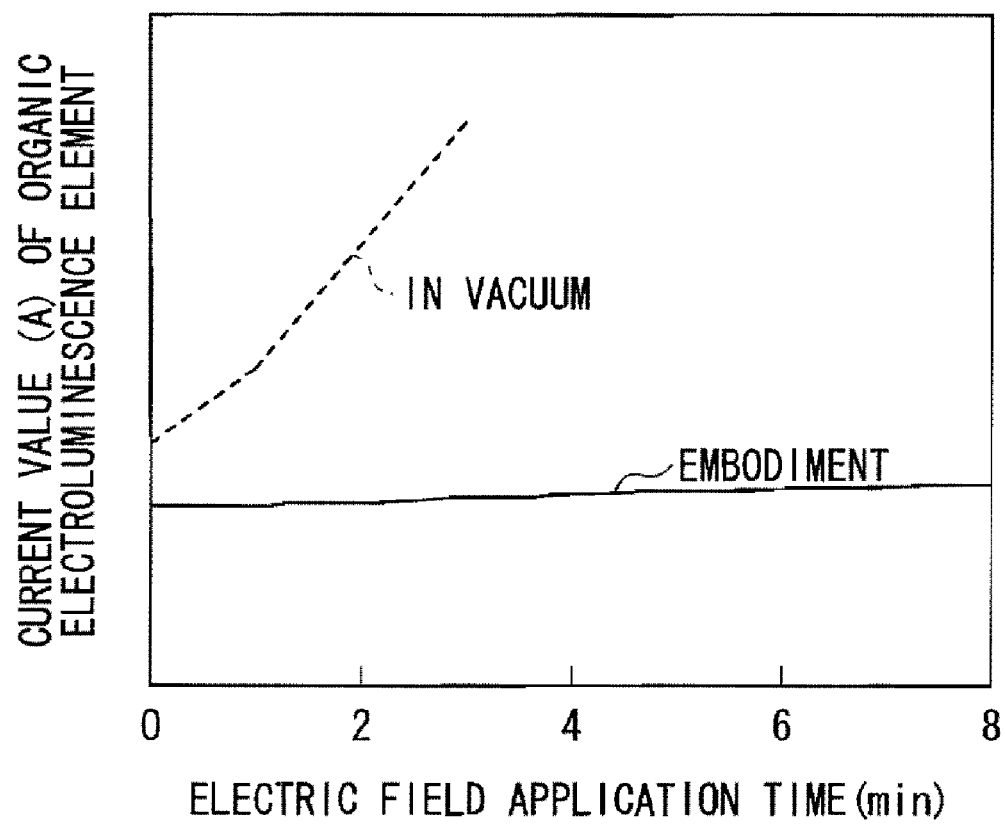
FIG. 6 is a diagram showing an experiment result of an embodiment of the invention.

The repairing process was actually performed by the manufacturing method, and the relation between the voltage application time and the current value of the organic electroluminescence elements 10R, 10G, and 10B was examined. The cathode 16 was formed by a MgAg alloy having a thickness of 10 nm. By introduction of gas into the aging chamber 41, the atmosphere having an oxygen concentration of 0.99% and a dew point of −60 degrees was obtained. As shown in FIG. 6, in the manufacturing method of the embodiment, the current value was extremely stable. In a comparative example where a repair was made in vacuum, the current value rose largely in extremely short time and measurement was not able to be performed. The reason was assumed that rise of the current value was not stopped by the synergy effect of the rise in current due to temperature dependency of the TFT characteristic and temperature rise due to heat generation of the organic electroluminescence elements.

Figure 7:
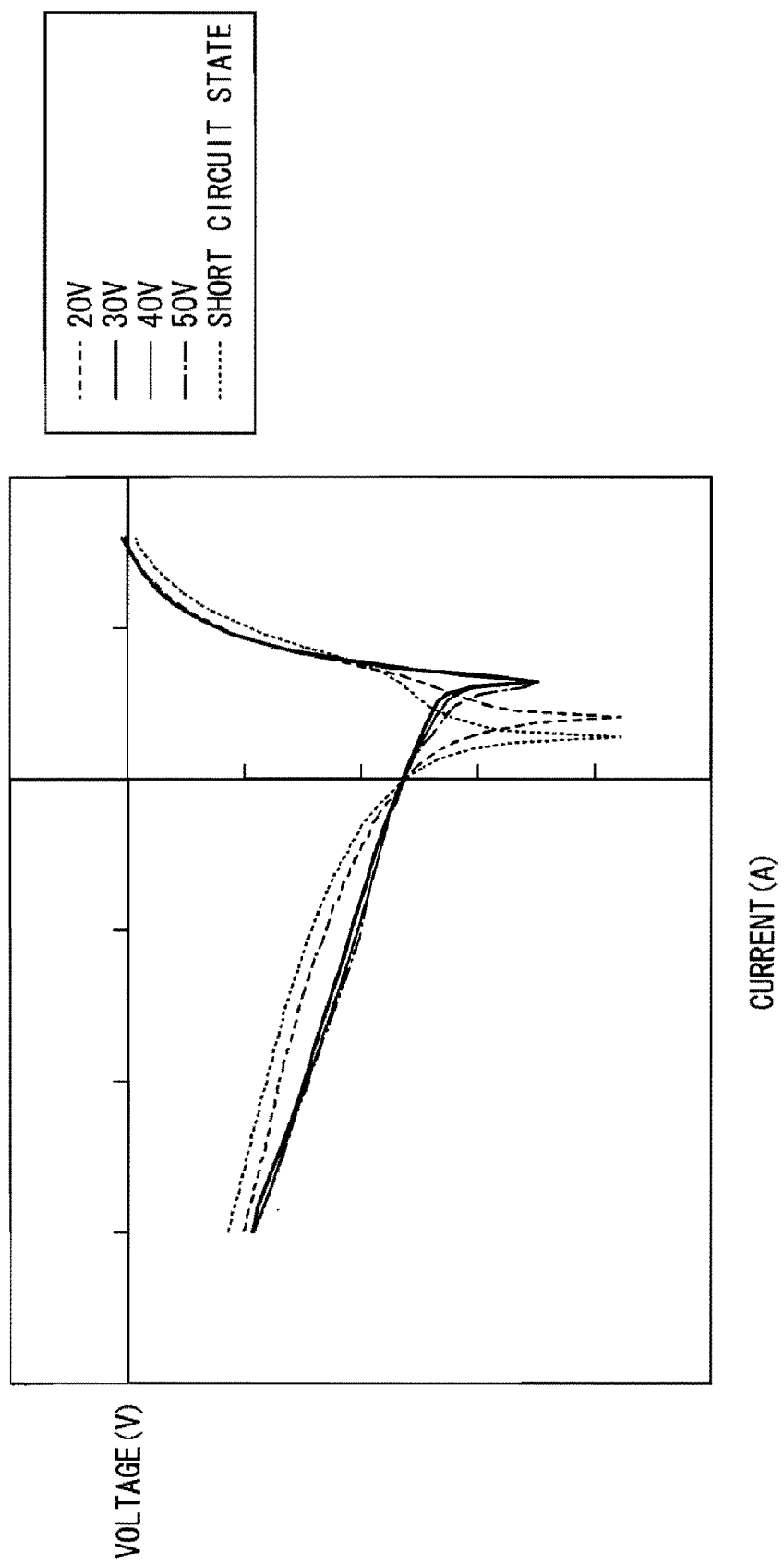
FIG. 7 is a diagram showing an experiment result of the embodiment.

The repairing process was actually performed by the manufacturing method, and the short-circuit characteristics were examined while changing the difference between the forward-direction potential and the inverse-direction potential applied to the organic electroluminescence elements 10R, 10G, and 10B like 20V, 30V, 40V, and 50V. As shown in FIG. 7, in the case where the difference between the forward-direction voltage and the inverse-direction potential was set to 30V or higher, leak was sufficiently prevented, and the short-circuit characteristics were largely improved. On the other hand, in the case of 20V, the short-circuit state hardly changed.

Figure 8:
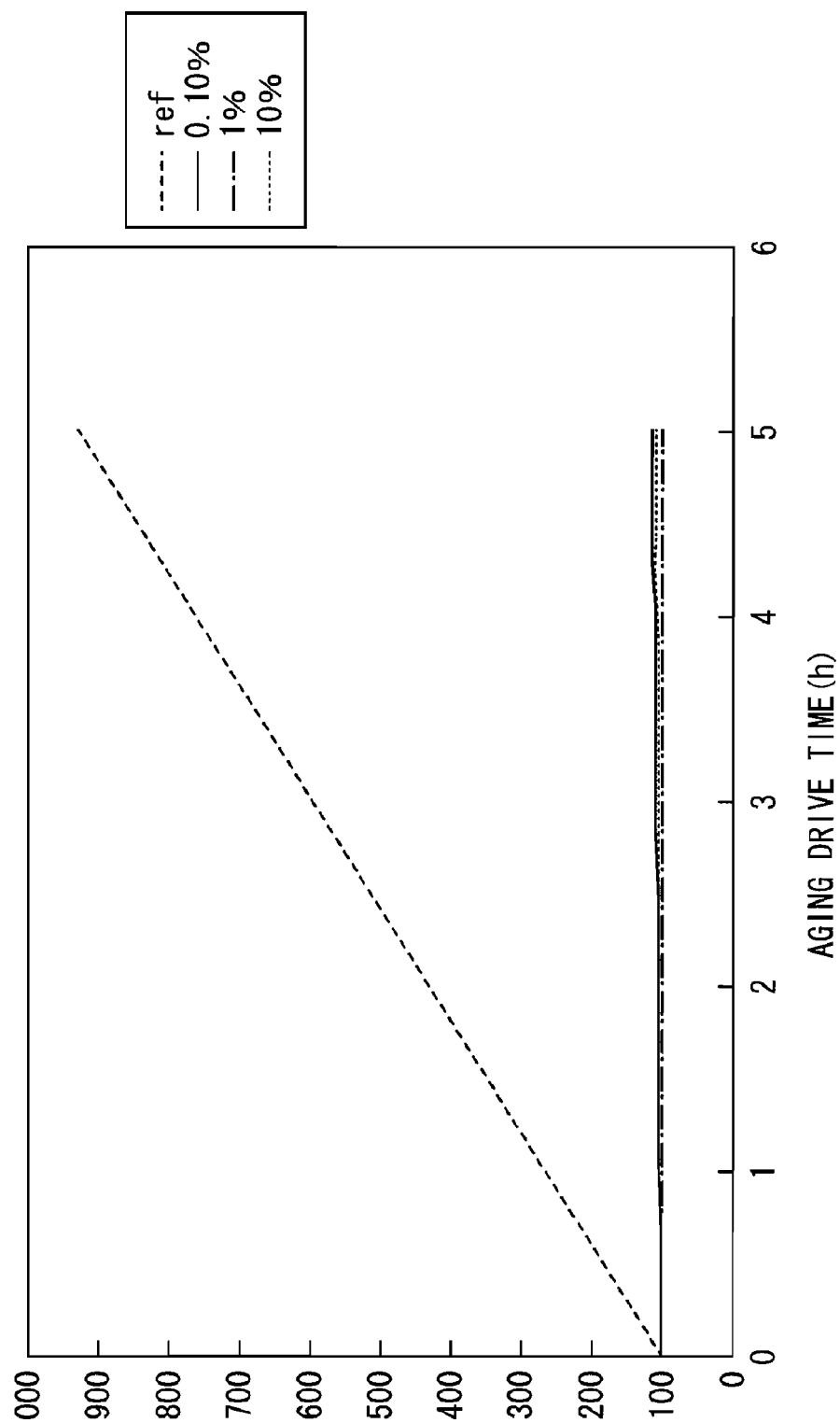
FIG. 8 is a diagram showing an experiment result of the embodiment.

Further, the repairing process was actually performed by the manufacturing method. While changing the oxygen concentration like 0.1%, 1%, and 10%, voltage application time was set to five hours, and the increasing ratio of the number of defects when the number of initial defects was set to 100% was examined. As shown in FIG. 8, at the oxygen concentration of 0.1%, the increasing ratio of the number of defects was suppressed to about the same as that in the case of related art where the oxygen concentration was set to 1% to 10%. Consequently, sufficiently high aging effect was obtained. In the case where the repairing process was not performed, the number of defects about nine times as many as the number of initial defects occurred later. It was therefore understood that, in the method of the embodiment, potential defects which are about nine times as many as the number of initial defects can be also repaired.

Figure 9:
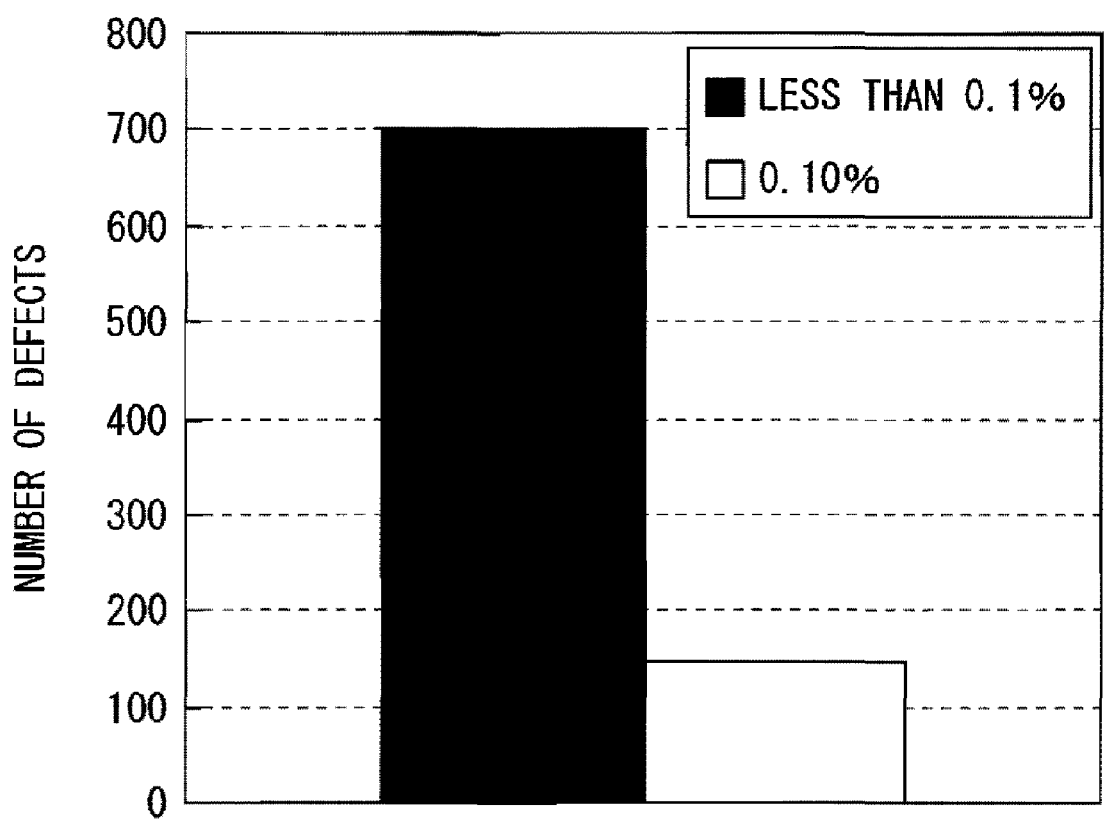
FIG. 9 is a diagram showing an experiment result of the embodiment.

In addition, the repairing process was performed actually by the manufacturing method and, while changing the oxygen concentration like less than 0.1% and 0.10%, the number of defects (the number of initial defects) in a display area was examined under those conditions. FIG. 9 shows the result. Three or more organic light-emitting devices under the conditions were manufactured, and an average of the numbers of defects of the devices was used as the number of defects. As understood from FIG. 9, the number of defects in the case where the oxygen concentration was set to 0.10% was conspicuously smaller than that in the case where the oxygen concentration was set to less than 0.1%. The reason is assumed that oxygen concentration of 0.1% or higher is necessary to produce sufficient effect of blowing, or oxidizing and insulating the cathode 16 where the short circuit occurs as described above. Although the number of initial defects is examined in FIG. 9, the inventors of the present invention empirically recognize that when the effect of reducing "the number of initial defects" is insufficient, the effect of reducing the number of potential defects is more insufficient. When the oxygen concentration is set to 0.10% or higher, it can be considered that the sufficient repair effect is obtained not only on the initial defects but also potential defects.

From the results of FIGS. 8 and 9, it is understood that, by setting the oxygen concentration to a value equal to or higher than 0.10% and less than 1% in the repairing process, the number of defects can be suppressed and also defects which occur later can be also suppressed.

In the organic light-emitting device, a scan signal is supplied via the gate electrode of the write transistor Tr2 from the scanning line drive circuit 130 to each of the pixels, and an image signal from the signal line drive circuit 120 is retained in a retentive capacitor Cs via the write transistor Tr2. That is, according to a signal retained in the retentive capacitor Cs, the drive transistor Tr1 is on/off controlled. By the control, the drive current Id is injected to the organic electroluminescence elements 10R, 10G, and 10B, and holes and electrons are recombined, thereby generating light. The light passes through the cathode 16, the protection film 17, and the opposed substrate 21 and is taken out. The repairing process is performed in such a manner that the drive substrate 11 formed in the element region 110 is housed in the aging chamber 41. By introducing gas into the aging chamber 41, the repairing process is performed in the atmosphere of oxygen concentration which is equal to or higher than 0.1% and less than 1%, and having a dew point of −50 degrees or less. Consequently, a pin hole (short circuit area) in the organic layer 15 or the like causing a display defect is sufficiently repaired. Therefore, the initial defects are eliminated and a potential defect which occurs due to load of light-on or driving or drive time is suppressed considerably.

As described above, in the embodiment, the repairing process is performed by housing the drive substrate 11 in which the element region 110 is formed in the aging chamber 41. In addition, gas is introduced into the aging chamber 41 to obtain the atmosphere having an oxygen concentration of 0.1% or higher and less than 1% and a dew point of −50 degrees or less. Consequently, while suppressing temperature rise or current rise, a pin hole (short circuit area) in the organic layer causing a display defect can be repaired. Therefore, the present invention is suitable for the case where the invention is applied to a large-screen display apparatus using an amorphous silicon TFT in which the temperature dependency of the I-V characteristic is high. High repairing effect can be obtained.

Modification 1

Figure 10:
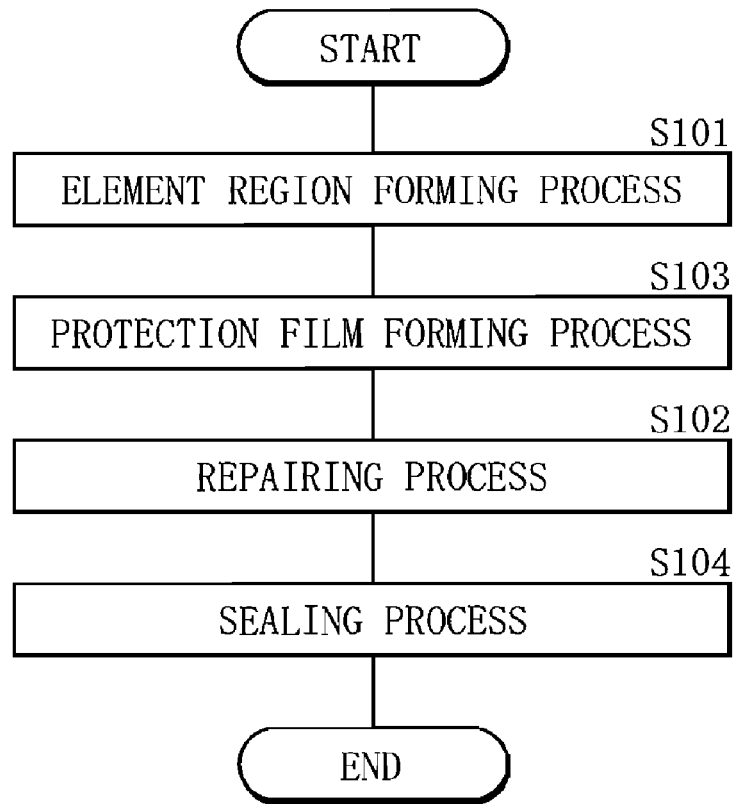
FIG. 10 is a diagram showing the flow of a method of manufacturing an organic light-emitting device as modification example 1 of the invention.

FIG. 10 shows the flow of a method of manufacturing an organic light-emitting device of a first modification of the present invention. The first modification is similar to the first embodiment except that, after the element region forming process, at least a part of the protection film 17 is formed before the repairing process, and the same actions and effects are obtained. Therefore, the modification will be described by assigning the same reference numerals to the corresponding components.

Element Region Forming Process (Step S101).

First, in a manner similar to the first embodiment, over the drive substrate 11, the pixel drive circuit 140 including the drive transistor Tr1 and the element region 110 including the organic electroluminescence elements 10R, 10G, and 10B are formed.

Protection Film Forming Process (Step S103)

Figure 11:
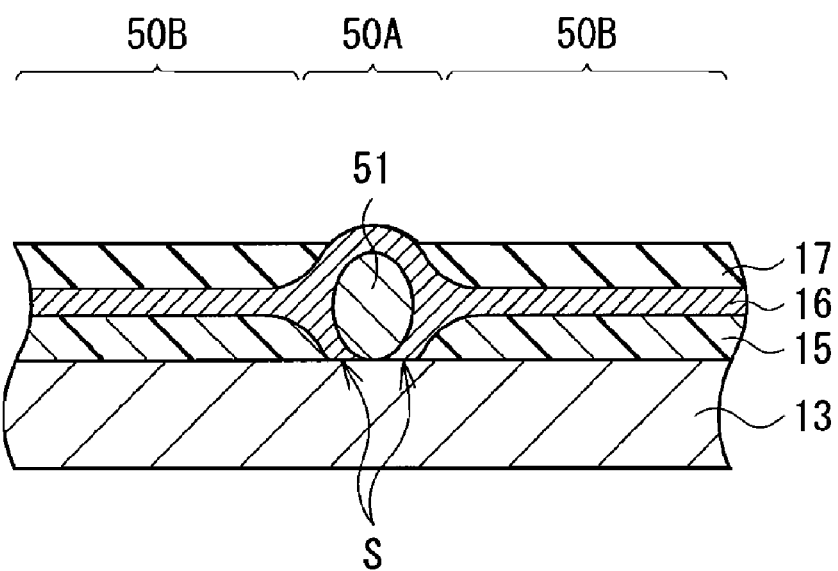
FIG. 11 is a cross section for explaining a protection film forming process shown in FIG. 10.

Subsequently, for example, by the CVD method, the protection film 17 made of the above-described material is formed. The thickness of the protection film 17 is set to a thickness to a degree that a region 50A to be repaired (repair necessary region) in the organic electroluminescence elements 10R, 10G, and 10B, concretely, for example, 0.2 μm or less. The repair necessary region 50A has a structural defect such as a foreign matter 51 as shown in FIG. 11. Around the foreign matter 51, there is a part where the organic layer 15 is not formed. This part is a short-circuit area S where the anode 13 and the cathode 16 are in contact and short-circuit occurs.

When the protection film 17 is formed very thinly with such a thickness on the cathode 16, a normal region 50B in the organic electroluminescence elements 10R, 10G, and 10B is covered with the protection film 17. However, the possibility that the protection film 17 covers the foreign matter 51 is low.

Repairing Process (Step S102)

Subsequently, in a manner similar to the first embodiment, the drive substrate 11 is housed in the aging chamber 41 and placed on the heat sink (radiating member) 42. The inside of the aging chamber 41 is set to the atmosphere having an oxygen concentration of 0.1% or higher and less than 1% and a dew point of −50 degrees or less. A voltage similar to that in the first embodiment is applied across the anode 13 and the cathode 16 in the organic electroluminescence elements 10R, 10G, and 10B. Since the protection film 17 having the above-described thickness is formed over the organic electroluminescence elements 10R, 10G, and 10B. Consequently, the normal region 50B in the organic electroluminescence elements 10R, 10G, and 10B is protected by the protection film 17 and is not exposed to the oxygen atmosphere. A fear such as deterioration is eliminated. On the other hand, the repair necessary region 50A is not covered with the protection film 17, so that it can be repaired by the self healing phenomenon.

After performing the repair process, an additional protection film 17 may be formed as necessary from the viewpoint of moisture-resistance performance.

Sealing Process (Step S104)

After that, in a manner similar to the first embodiment, the adhesion layer 30 is formed on the protection film 17, and the drive substrate 11 and the opposed substrate 21 are adhered to each other with the adhesion layer 30 therebetween. In such a manner, the organic light-emitting device shown in FIG. 3 is completed.

Second Embodiment

Figure 12:
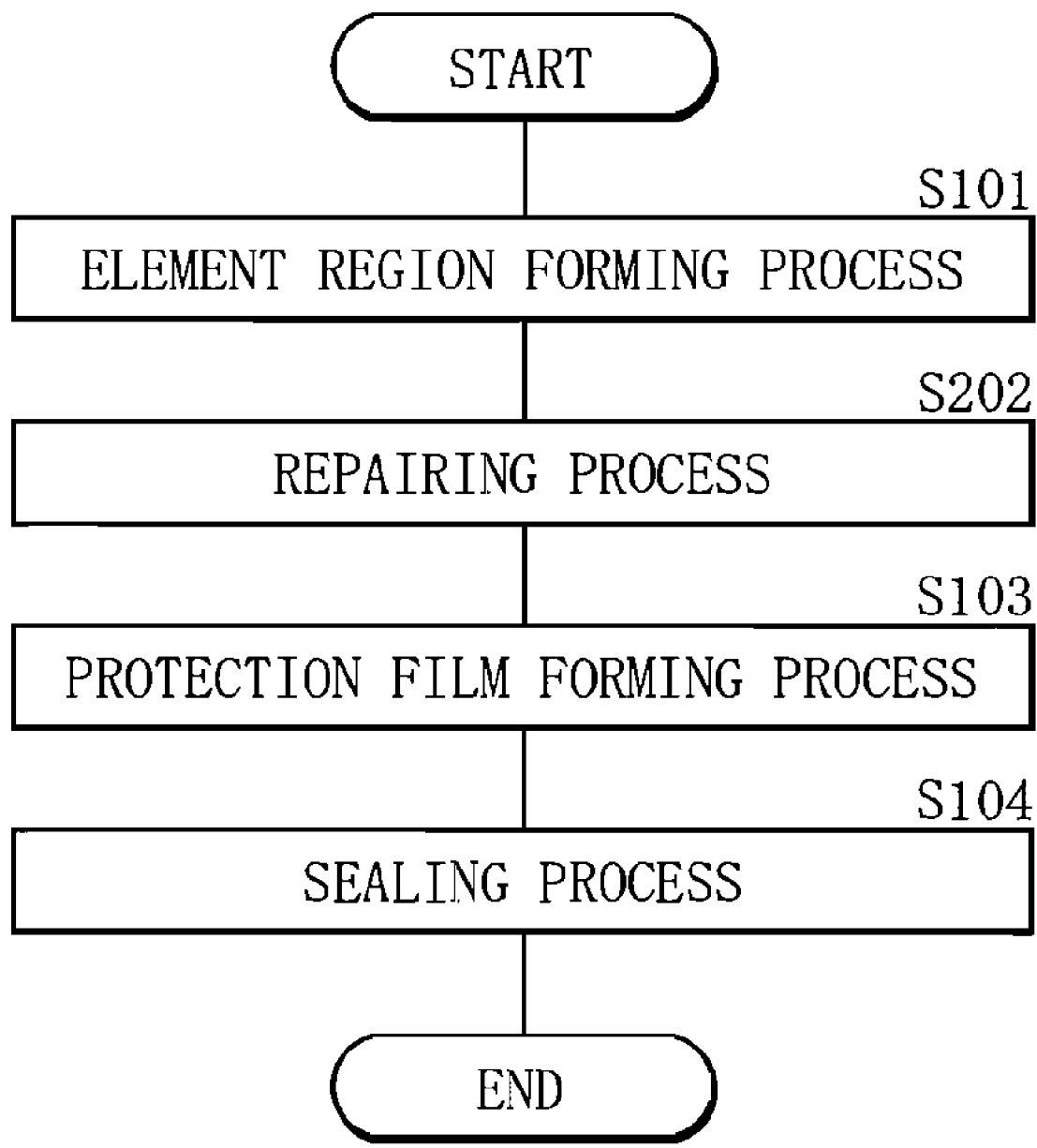
FIG. 12 is a diagram showing the flow of a method of manufacturing an organic light-emitting device as a second embodiment of the present invention.

FIG. 12 shows the flow of a method of manufacturing an organic light-emitting device of a second embodiment of the present invention. The second embodiment is similar to the first embodiment except for the repairing process, and the actions and effects of the second embodiment are the same as those of the first embodiment. Therefore, the second embodiment will be described by assigning the same reference numerals to the corresponding components.

Element Region Forming Process (Step S101).

First, in a manner similar to the first embodiment, over the drive substrate 11, the pixel drive circuit 140 including the drive transistor Tr1 and the element region 110 including the organic electroluminescence elements 10R, 10G, and 10B are formed.

Repairing Process (Step S202)

Figure 13:
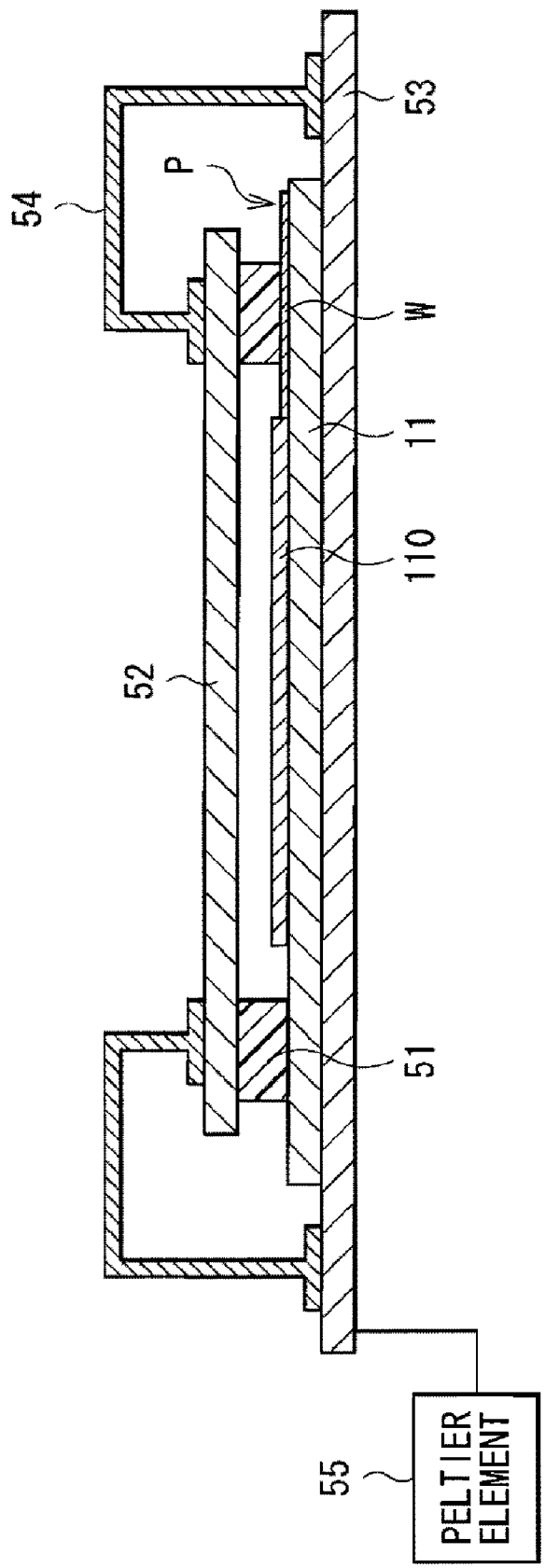
FIG. 13 is a diagram for explaining a repairing process shown in FIG. 12.

Subsequently, as shown in FIG. 13, the element region 110 is temporarily sealed by using a seal layer 51 and a shield substrate 52.

First, by applying an adhesive resin or sticky region to the periphery of the drive substrate 11 or by patterning the organic insulating film, the seal layer 51 is formed. The material of the seal layer 51 is not limited as long as it has excellent adhesion with the drive substrate 11 and the shield substrate 52 which will be described later and can sufficiently block the external atmosphere.

Subsequently, as shown in FIG. 13, the shield substrate 52 seals so as to cover the element region 110 with an atmosphere having an oxygen concentration of 0.1% or higher and less than 1% and a dew point of −50 degrees or less, so that the element region 110 lies in the atmosphere having the oxygen concentration of 0.1% or higher and less than 1% and the dew point of −50 degrees or less. The material of the shield substrate 52 may be any material such as glass or aluminum (Al) as long as it has excellent adhesion with the seal layer 51 and can sufficiently block the external atmosphere.

Further, as shown in FIG. 13, the drive substrate 11 may be supported by a shield support substrate 53 made of an alloy containing a stainless steel or aluminum, or the like, and the shield substrate 52 may be fixed by a shield substrate fixture 54.

As described above, the element region 110 is temporarily sealed in an atmosphere of an oxygen concentration of 0.1% or higher and less than 1% and a dew point of −50 degrees or less. After that, the drive substrate 11 is exposed to the normal atmosphere. In this state, the probe P is made contact with the wiring W led from the element region 110, and a voltage similar to that in the first embodiment is applied across the anode 13 and the cathode 16 in the organic electroluminescence elements 10R, 10G, and 10B. With such a configuration, for example, even by a simple method of sending air to the drive substrate 11 in the normal atmosphere by using a blower or the like, temperature rise accompanying heat generation of the organic electroluminescence elements 10R, 10G, and 10B by voltage application is suppressed, and the element region 110 can be cooled or radiated. As a result, excessive rise in current is suppressed, and the repairing process can be performed in a state where current is sufficiently stable. Therefore, the repairing process can be performed in the normal atmosphere, and facility can be largely simplified.

Further, it is preferable to cool the drive substrate 11 by a Peltier element 55 so that a higher effect can be obtained.

Protection Film Forming Process (Step S103)

After performing the repairing process, the shield substrate 52 is removed. In a manner similar to the first embodiment, the protection film 17 is formed to cover the organic electroluminescence elements 10R, 10G, and 10B. The seal layer 51 may be removed as necessary.

Sealing Process (Step S104)

After that, in a manner similar to the first embodiment, the adhesive layer 30 is formed on the protection film 17, and the drive substrate 11 and the opposed substrate 21 are adhered to each other with the adhesive layer 30 therebetween. In such a manner, the organic light-emitting device shown in FIG. 3 is completed.

MODULE AND APPLICATION EXAMPLES

Examples of applying the organic light-emitting devices described in the foregoing embodiments will be described below. The organic light-emitting devices of the foregoing embodiments is applicable to display devices of electronic equipment in all of fields of displaying a video signal input from the outside or a video signal internally generated as an image or video image, such as a television set, a digital camera, a notebook-sized personal computer, a portable terminal device such as a cellular phone, a video camera, or the like.

Module

Figure 14:
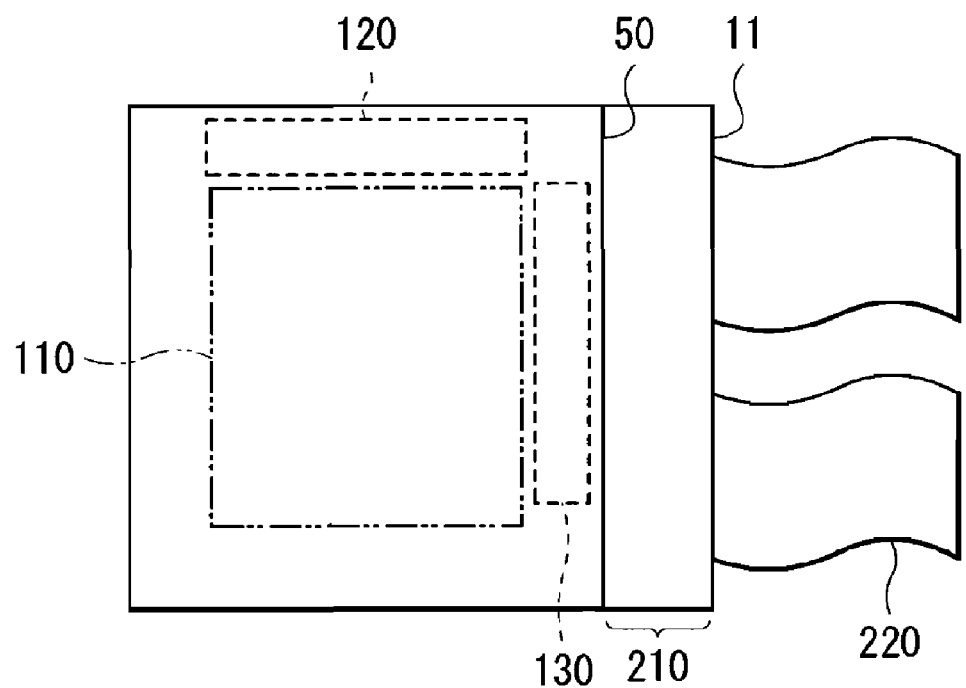
FIG. 14 is a plan view showing a schematic configuration of a module including an organic light-emitting device of the embodiment.

The organic light-emitting device in the foregoing embodiments is assembled, for example, as a module as shown in FIG. 14, in various electronic devices of application examples 1 to 5 which will be described below. The module is obtained by, for example, providing a region 210 exposed from a sealing substrate 50 and an adhesive layer 40 in one side of the drive substrate 11 and forming an external connection terminal (not shown) by extending the wiring of the signal line drive circuit 120 and the scanning line drive circuit 130 in the exposed region 210. The external connection terminal may be provided with a flexible printed circuit (FPC) 220 for inputting/outputting signals.

Application Example 1

Figure 15:
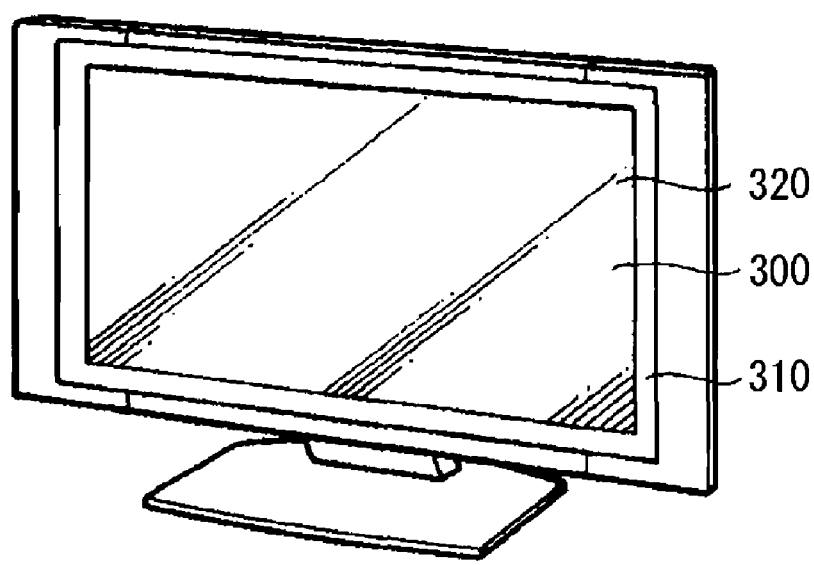
FIG. 15 is a perspective view showing the appearance of application example 1 of the organic light-emitting device of the embodiment.

FIG. 15 shows the appearance of a television set to which the organic light-emitting device of the embodiments is applied. The television set has, for example, a video display screen section 300 including a front panel 310 and a filter glass 320. The video display screen section 300 is constructed by the organic light-emitting device of any of the foregoing embodiments.

Application Example 2

Figure 16A:
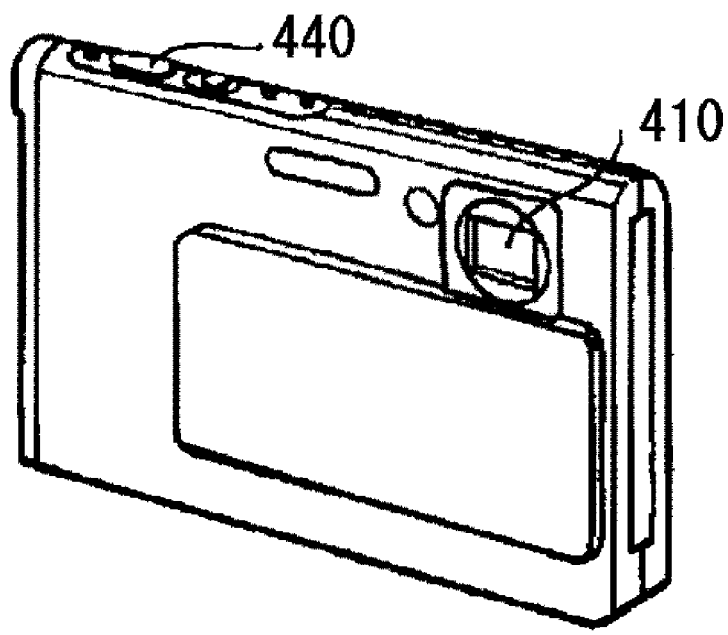
FIG. 16A is a perspective view showing the appearance seen from the surface side of application example 2.
Figure 16B:
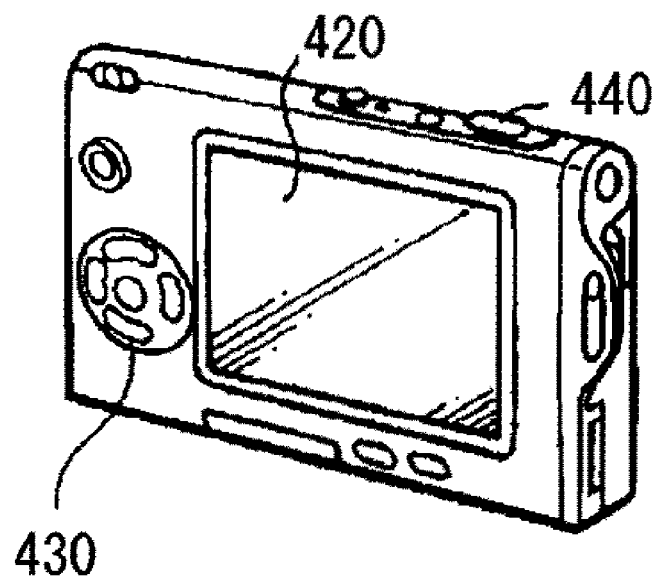
FIG. 16B is a perspective view showing the appearance seen from the back side.

FIGS. 16A and 16B show the appearance of a digital camera to which the organic light-emitting device of any of the embodiments is applied. The digital camera has, for example, a light emitter 410 for flash, a display 420, a menu switch 430 and a shutter button 440. The display 420 is constructed by the organic light-emitting device of any of the foregoing embodiments.

Application Example 3

Figure 17:
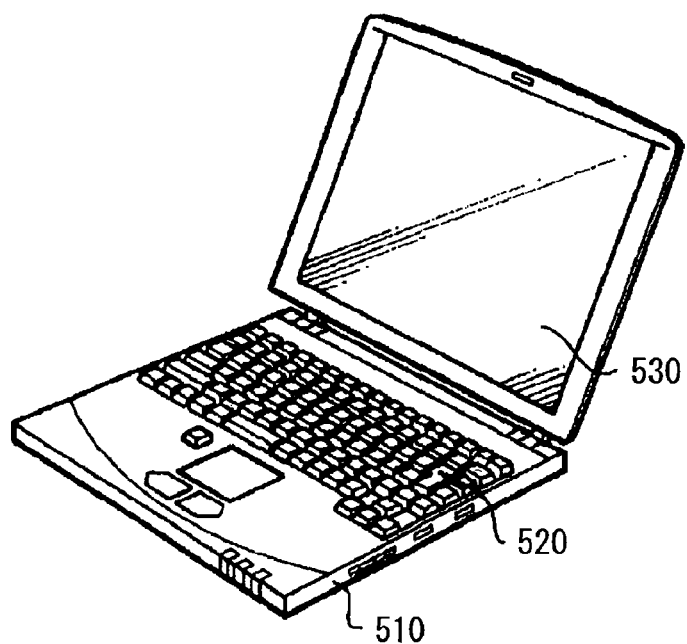
FIG. 17 is a perspective view showing the appearance of application example 3.

FIG. 17 shows the appearance of a notebook-sized personal computer to which the organic light-emitting device of any of the embodiments is applied. The notebook-sized personal computer has, for example, a body 510, a keyboard 520 for an operation of inputting characters and the like, and a display 530 for displaying an image. The display 530 is constructed by the organic light-emitting device of any of the foregoing embodiments.

Application Example 4

Figure 18:
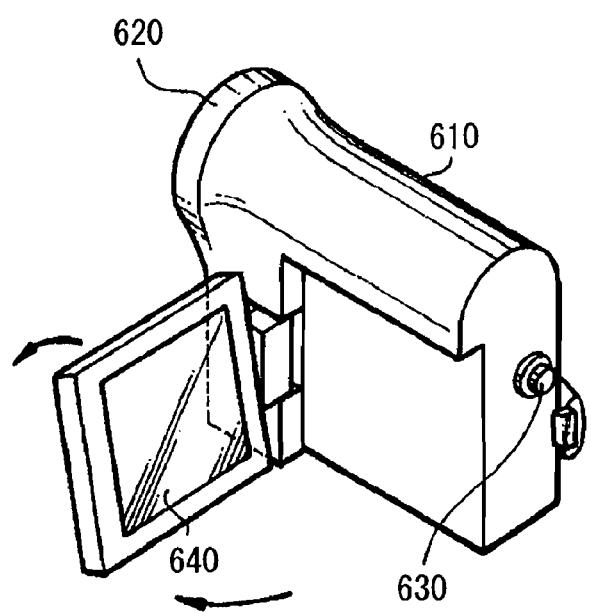
FIG. 18 is a perspective view showing the appearance of application example 4.

FIG. 18 shows the appearance of a video camera to which the organic light-emitting device of any of the embodiments is applied. The video camera has, for example, a body 610, a lens 620 for capturing a subject, which is provided on the front face of the body 610, an image capture start/stop switch 630, and a display 640. The display 640 is constructed by the organic light-emitting device of any of the foregoing embodiments.

Application Example 5

FIGS. 19A to 19G show the appearance of a cellular phone to which the organic light-emitting device of any of the foregoing embodiments is applied. The cellular phone is obtained by, for example, coupling an upper casing 710 and a lower casing 720 via a coupling unit (hinge) 730 and has a display 740, a sub-display 750, a picture light 760, and a camera 770. Each of the display 740 and the sub-display 750 is constructed by the organic light-emitting device of any of the foregoing embodiments.

Although the present invention has been described by the foregoing embodiments, the invention is not limited to the embodiments but may be variously modified. For example, in the foregoing embodiments, voltage is applied across the anode 13 and the cathode 16 in the repairing process. Alternatively, ultraviolet rays (UV) may be emitted during a repair. Since oxidation contributes in a repair, by emitting ultraviolet rays in place of heat, the repair can be promoted.

The first modification can be also applied to the second embodiment.

Further, the invention is not limited to, for example, the materials, thicknesses, the film forming methods, the film forming parameters, and the like of the layers described in the embodiments. Other materials, thicknesses, film forming methods, and film forming parameters may be used.

In addition, although the configuration of the organic electroluminescence elements 10R, 10G, and 10B has been described concretely in the foregoing embodiments, it is unnecessary to provide all of the layers, or another layer may be further provided. For example, a hole injection thin film made of chromium trioxide ($Cr_2O_3$), ITO (Indium-Tin Oxide, oxide mixture film of indium (In) and tin (Sn)), or the like may be provided between the anode 13 and the organic layer 15. For example, the anode 13 may be formed by a dielectric multilayer film.

Further, although the case of the active matrix driving method has been described in the embodiments, the present invention is also applicable to a simple matrix driving method. In addition, the configuration of a pixel drive circuit for active matrix driving is not limited to that described in the embodiments. As necessary, a capacitive element and a transistor may be added. In this case, according to a change in the pixel drive circuit, a necessary drive circuit other than the signal line drive circuit 120 and the scanning line drive circuit 130 may be added.

Obviously many modifications and variations of the present invention are possible in the light of the above teachings. It is therefore to be understood that within the scope of the appended claims the invention may be practiced otherwise than as specifically described.

What is claimed is:

1. A method of manufacturing an organic light-emitting device, comprising the steps of:
    forming, over a drive substrate, an element region including a drive transistor, and an organic electroluminescence element in which, an anode, an organic layer and a cathode are stacked in this order;
    after forming the element region, forming a protection film on the cathode;
    after forming the protection film, repairing a short circuit area in which the anode contacts the cathode by applying a voltage across the anode and the cathode while simultaneously subjecting at least the element region, when the voltage is applied, in an atmosphere in which an oxygen concentration by volume is 0.1% or higher and less than 1% and a dew point temperature is −50 degrees or less, and
    completing the manufacture of the organic light-emitting device, said repairing step occurring prior to the completion of the organic light-emitting device,
    wherein,
        the protection film is formed to have a thickness such that a part of the cathode within the short circuit area is not covered by the protection film,
        the voltage applied across the anode and the cathode in repairing is of an alternating application method of alternately applying a forward-direction potential and an inverse-direction potential, and
        the difference between the forward-direction potential and the inverse-direction potential applied to the organic electroluminescence element is set to 30V or higher, and equal to or lower than an initial withstand voltage of the drive transistor.

2. The method according to claim 1, wherein the repairing step is performed in a state where the drive substrate over which the element region is formed in a chamber and a gas is introduced into the chamber.

3. The method according to claim 1, wherein after forming the element region, and before the repairing step, the thickness of the protection film is such that a portion of the cathode is covered by the protection film and a portion of the short circuit area extends above the protection film.

4. The method of claim 3, wherein the protection film has a thickness of 2 μm or less.

5. The method of claim 1, wherein the repairing includes:
    placing the drive substrate on a heat sink within a chamber, and
    introducing a gas into the chamber to convert the atmosphere of the chamber such that the oxygen concentration by volume is 0.1% or higher and less than 1% and the dew point is −50 degrees or less.

* * * * *